US006921938B2

(12) United States Patent
Blanchard

(10) Patent No.: US 6,921,938 B2
(45) Date of Patent: Jul. 26, 2005

(54) DOUBLE DIFFUSED FIELD EFFECT TRANSISTOR HAVING REDUCED ON-RESISTANCE

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/812,159

(22) Filed: Mar. 29, 2004

(65) Prior Publication Data

US 2004/0178444 A1 Sep. 16, 2004

Related U.S. Application Data

(62) Division of application No. 09/819,356, filed on Mar. 28, 2001, now Pat. No. 6,713,351.

(51) Int. Cl.[7] .............................................. H01L 29/76
(52) U.S. Cl. ........................ 257/328; 257/328; 257/332
(58) Field of Search ................................ 257/328, 332, 257/341, 401, 549, 342, 345; 438/268, 263

(56) References Cited

U.S. PATENT DOCUMENTS

| 5,072,266 | A | | 12/1991 | Bulucea et al. | |
|---|---|---|---|---|---|
| 5,701,023 | A | * | 12/1997 | Bulucea et al. | ............. 257/341 |
| 5,814,858 | A | | 9/1998 | Williams | |
| 5,893,742 | A | | 4/1999 | Demirliogluy et al. | |
| 5,897,355 | A | * | 4/1999 | Bulucea et al. | ............. 438/273 |
| 5,981,344 | A | | 11/1999 | Hshieh et al. | |
| 6,084,268 | A | | 7/2000 | De Fresart et al. | |
| 6,274,464 | B2 | | 8/2001 | Drobny et al. | |

OTHER PUBLICATIONS

Baliga, B. Jayant, Chapter 7, "Power Mosfet: 7.1 Basic Structure and Operation," PWS Publishing (Boston, 1996), pp. 336–339.

Wolf, Stanley et al., "Silicon Processing for the VLSI Era", vol. 1:Process Technology, Lattice Press, Sunset Beach, CA, (1986), pp. 321–323.

Wilson, Syd R., et al., "Handbook of Multilevel Metallization for Integrated Circuits," Noyes Publ., Westwood, New Jersey, (1993), pp. 42–59; 867–872.

IBM Technical Disclosure Bulletin, "Fabrication of Narrow Self Aligned Trenches and Isolated N–Type Silicon Region With buried N+ Layer," vol. 34, No. 10A, (Mar., 1992), pp. 397–399.

Gary E. McGuire, Semiconductor Materials and Process Technology Handbook, Noyes Publ., Norwich, New York, (1988), p. 18.

Hu, Chenning, "Optimum Doping Profile for Minimum Ohmic Resistance and High–Breakdown Voltage," IEEE Transactions on Electron Devices, vol. ED–26, No. 3, Mar. 1979, pp. 243–244.

Grove, A. S., Physics and Technology of Semiconductor Devices, 3.7, "The Redistribution of Impurities in Epitaxial Growth," pp. 78–83, John Wiley and Sons, Inc. New York, 1967.

* cited by examiner

Primary Examiner—David Nelms
Assistant Examiner—Thinh T Nguyen
(74) Attorney, Agent, or Firm—Mayer Fortkort & Williams PC; Stuart H. Mayer, Esq.; Karin L. Williams, Esq.

(57) ABSTRACT

A double diffused field effect transistor and a method of forming the same is provided. The method begins by providing a substrate of a first conductivity type. Next, at least one dopant species, also of the first conductivity type, is introduced into a surface of the substrate so that the substrate has a nonuniform doping profile. An epitaxial layer of the first conductivity type is formed over the substrate and one or more body regions of a second conductivity type are formed within the epitaxial layer. A plurality of source regions of the first conductivity type are then formed within the body regions. Finally, a gate region is formed, which is adjacent to the body regions.

8 Claims, 6 Drawing Sheets

PROFILES AFTER THE EPI GROWTH AND DIFFUSION

THE IMPLANTATION OF BOTH ARSENIC AND PHOSPHORUS
AT THE SURFACE OF THE UNDERLYING SUBSTRATE
PRIOR TO EPI DEPOSITION

PROFILES AFTER THE EPI GROWTH AND DIFFUSION

DOUBLE DIFFUSED FIELD EFFECT TRANSISTOR HAVING REDUCED ON-RESISTANCE

STATEMENT OF RELATED APPLICATION

This application is a divisional of U.S. patent application Ser. No. 09/819,356, filed Mar. 28, 2001 now U.S. Pat. No. 6,713,351, entitled "Double Diffused Field Effect Transistor Having Reduced On-Resistance," which is incorporated by reference in its entirety herein.

FIELD OF THE INVENTION

This invention relates generally to semiconductor wafer processing and more particularly to a method for forming a double diffused field effect transistor.

BACKGROUND INFORMATION

Power MOSFET devices are well known and are used in many applications including automotive electronics, portable electronics, power supplies, and telecommunications. One important electrical characteristic of a power MOSFET device is its on-state resistance ($R_{DSon}$), which is defined as the total resistance encountered by the carriers as they flow from the source terminal to the drain terminal. In order to allow manufacturers to produce power MOSFET devices having higher current carrying capability in smaller packages, it would be advantageous to have MOSFET structures that reduce the on-state resistance FIG. 1 is a simplified cross-sectional diagram of a conventional n-channel power MOSFET referred to as a double diffused field effect transistor. A layer of N type epitaxial silicon 1 is formed on an N+ type substrate 2. A P body region 3A and a P+ body region 3B are formed into the epitaxial layer from upper surface 4, and an N+ type source region 5 is formed into the body regions 3A and 3B from upper surface 4. To turn the transistor on (i.e., make it conductive), a positive potential is placed on gate 6. The positive potential on gate 6 causes what is called a channel region to form in the surface portion of P body region 3A underneath the gate and also causes what is called an accumulation region to form in the surface portion of the N type epitaxial silicon region 1A immediately underneath the gate. Electrons can then flow as generally indicated by the arrow from the N+ type source region 5, through the channel region in P body region 3A, through the accumulation region of N type epitaxial layer 1A, downward through the N type epitaxial region 1A, downward through the N+ type substrate 2, and to a drain electrode 7. If gate 6 does not have a positive potential, then no channel is formed and no electron flow from source to drain takes place. The transistor is therefore turned off (i.e., nonconductive).

FIG. 2 is a simplified cross-sectional diagram of another type of double diffused field effect transistor, a trench field effect transistor. In FIGS. 1 and 2 like elements are represented by reference numerals. An N type epitaxial layer 1 is formed on a N+ type substrate 2. Body regions 3A and 3B and N+ type source region 5 are then formed in similar double diffused fashion to the body and source regions in the planar transistor. In the case of the trench transistor, a trench is etched down into epitaxial layer 1 from upper surface 4. A gate oxide layer 8 is then grown in this trench on the side walls and the trench bottom. An amount of polysilicon or other suitable material is then deposited on the gate oxide in the trench to form a gate 9. For additional information on trench field effect transistors, see U.S. Pat. No. 5,072,266 entitled "Trench DMOS Power Transistor With Field-Shaping Body Profile And Three-Dimensional Geometry", the subject matter of which is incorporated herein by reference.

To turn the trench transistor on, a positive potential is placed on gate 9. The positive potential causes a channel region to form in the portion of the P body region 3A which forms part of the sidewall of the trench and causes an accumulation region to form in the portion of the N type epitaxial layer region 1A which forms a part of the sidewall of the trench. Electrons can then flow as indicated by the arrow from the N+ type source region 5, downward through the channel region of P body region 3A, downward through the accumulation region, downward through the remainder of the N type epitaxial region 1A, downward through the N+ type substrate 2, and to a drain electrode 7. If gate 9 does not have a positive potential, then no channel is formed and no electron flow from source to drain takes place. The transistor is therefore turned off.

It is desirable that such transistors have low source-to-drain resistances $R_{DSon}$ when turned on. As depicted pictorially in FIG. 1, the resistance $R_{DSon}$ in the planar structure is made up of the resistance $R_{CH}$ through the channel, the resistance $R_{ACC}$ laterally through the accumulation region, the resistance $R_{JFET}$ vertically through the pinched portion of the N type epitaxial region 1A between the two adjacent P body regions, the resistance $R_{DRIFT}$ vertically through the remainder of the N type epitaxial region 1A to the substrate, and the resistance $R_{SUB}$ vertically through the substrate to the drain electrode. As depicted pictorially in FIG. 2, the resistance $R_{DSon}$ in the trench structure is made up of the resistance $R_{CH}$ vertically through the channel, the resistance $R_{ACC}$ vertically through the accumulation region, the resistance $R_{DRIFT}$ vertically through the remainder of the N type epitaxial region 1A, and the resistance $R_{SUB}$ vertically through the substrate to the drain electrode. Note that $R_{JFET}$ is eliminated in the trench device. Because the conductivity of silicon increases with dopant concentration, epitaxial silicon layer 1 is relatively heavily doped to reduce the $R_{DRIFT}$ and thereby reduce $R_{DSon}$.

It is also desirable that such transistors have a high breakdown voltage so that they can be operated at high voltages and thus serve as high power devices. As is well known to those or ordinary skill, the breakdown voltage increases with decreasing dopant concentration in the epitaxial region 1A and increasing thickness of the epitaxial region 1A. Since the magnitude of the on-resistance and the breakdown voltage vary in a similar manner with respect to dopant concentration, decreasing the on-resistance of a double diffused field effect transistor by increasing the doping concentration in the epitaxial region 1A causes an undesirable decrease in the breakdown voltage of the device.

U.S. Pat. No. 6,084,268 discloses a power MOSFET in which the on-resistance is reduced by providing regions of localized doping within the epitaxial layer 1A. The regions of localized doping have the same conductivity type as epitaxial layer 1A, but with a higher dopant concentration, thereby lowering the series resistance between the channel regions and the drain region of device. Also, the regions of localized doping are limited so that they are spaced apart from p-type regions 3B to minimize a decrease in breakdown voltage that may also arise. On problem with this technique is that it requires additional masking steps and high energy ion implantation techniques to form the localized doping region.

Accordingly, it would be desirable to provide a double diffused field effect transistor having a reduced on-resistance without detrimentally impacting the breakdown voltage of the device and which is also relatively easy to manufacture.

SUMMARY OF THE INVENTION

The present invention provides a double diffused field effect transistor and a method of forming the same. The method begins by providing a substrate of a first conductivity type. Next, at least one dopant species, also of the first conductivity type, is introduced into a surface of the substrate so that the substrate has a nonuniform doping profile. An epitaxial layer of the first conductivity type is formed over the substrate and one or more body regions of a second conductivity type are formed within the epitaxial layer. A plurality of source regions of the first conductivity type are then formed within the body regions. Finally, a gate region is formed, which is adjacent to the body regions.

In accordance with one aspect of the invention, the gate region is formed by locating a plurality of trenches within the epitaxial layer and then lining the trenches with a first insulating layer. A polysilicon conductor is provided within the trenches and overlies the first insulating layer.

In accordance with yet another aspect of the invention the dopant species is introduced into the substrate by ion implantation.

In accordance with another aspect of the invention, the dopant species that is introduced is selected from the group consisting of arsenic, antimony and phosphorous.

In accordance with another aspect of the invention, the substrate has a substantially uniform doping profile prior to introducing the dopant species.

In accordance with another aspect of the invention, a double diffused field effect transistor is provided which includes a substrate of a first conductivity type. At least one dopant species, also of the first conductivity type, is incorporated into a surface of the substrate so that the substrate has a nonuniform doping profile. The nonuniform doping profile has a dopant concentration that is greatest at a given depth below a surface layer of the substrate. The dopant concentration decreases with increasing distance away from this given depth. An epitaxial layer of the first conductivity type is located over the surface layer of the substrate. One or more body regions of a second conductivity type are disposed within the epitaxial layer. A plurality of source regions of the first conductivity type are located within the body regions. A gate region is located adjacent to the body regions.

DETAILED DESCRIPTION

Figure 3:
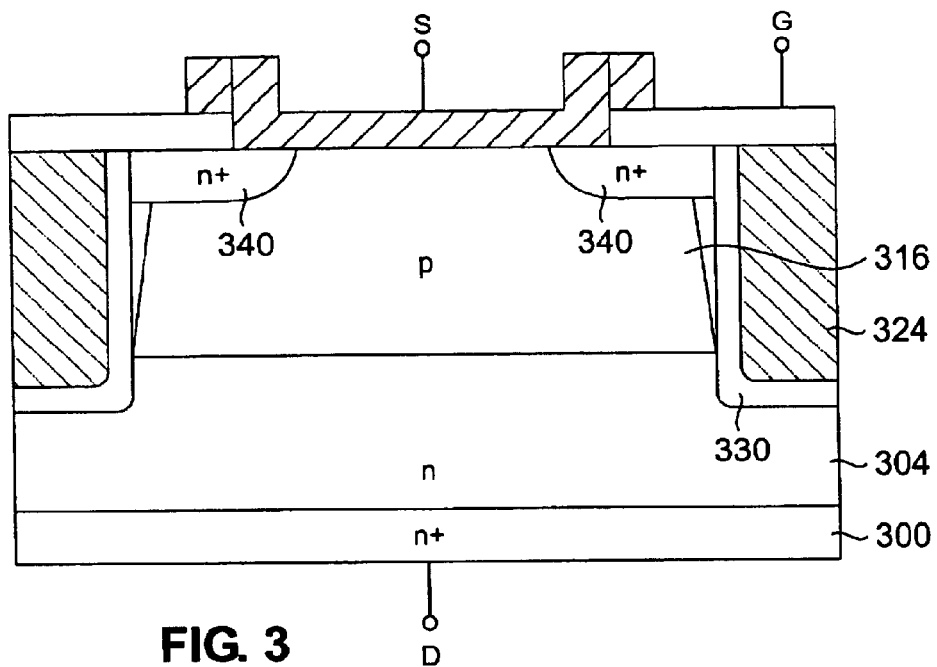
FIG. 3 illustrates one embodiment of a trench field effect transistor constructed in accordance with the present invention.

FIG. 3 illustrates one embodiment of a trench field effect transistor constructed in accordance with the present invention. The structure includes, in this embodiment, an n+ substrate 300 on which is grown a lightly n-doped epitaxial layer 304. As described in more detail below, the surface region of substrate 300 has a higher dopant concentration than its interior. Within doped epitaxial layer 304, a body region 316 of opposite conductivity is provided. An n+-doped region 340 that overlies most of the body region 316 serves as the source. A rectangular shaped trench 324 is provided in the epitaxial layers, which is open at the upper surface of the structure and defines the perimeter of the transistor cell. A gate oxide layer 330 lines the sidewalls of the trench 324. The trench 324 is filled with polysilicon, i.e., polycrystalline silicon that has been doped to make it conductive. A drain electrode is connected to the back surface of the semiconductor substrate 300, a source electrode is connected to the two source regions 340 and the body region 316, and a gate electrode is connected to the polysilicon that fills the trench 324.

The breakdown voltage of a double diffused field effect transistor is largely determined by the doping concentration of the portion of epitaxial layer 304 near the surface of the device. In particular, the breakdown voltage is determined by the doping concentration of the portion of epitaxial layer 304 adjacent the P-body region 316. In other words, variations in the doping concentration of the portion of the epitaxial layer 304 in the vicinity of the substrate 300 do not have a large impact on the breakdown voltage. As a result, it is in principle possible to reduce the on-resistance of the device without also creating an unduly large decrease in the breakdown voltage by only increasing the doping concentration of the epitaxial layer 304 in the vicinity of the substrate. That is, epitaxial layer 304 may have a tapered doping profile in which the deposition process is performed so that the doping concentration increases with increasing depth into the epitaxial layer 304. Double diffused field effect transistors with such a tapered doping profile are well-known. Unfortunately, one problem with a tapered doping profile is that it requires a relatively complex epitaxial deposition process.

In accordance with the present invention, one or more species of dopants are introduced into the surface of the substrate 300 before any layers are grown on it. The dopants may be introduced by ion implantation. This step provides a substrate with a varying doping concentration profile that is greatest at the substrate surface and which decreases with increasing depth into the substrate. It should be noted that commercially available substrates typically have a uniform doping profile with concentrations up to about $1 \times 10^{19}/cm^3$, which corresponds to a resistance as low as 0.005 ohm-cm.

During the formation of epitaxial layer 304 on the substrate 300 and during subsequent high temperature processing, so-called up-doping occurs in which the additional dopants incorporated into substrate 300 diffuse into the epitaxial layer 304. Since the dopants are introduced into the epitaxial layer 304 from the substrate 300, they primary affect the epitaxial layer's dopant concentration near the substrate 300 with relatively little impact on its doping concentration near the surface. As a result, the on-resistance of the resulting device is reduced without a commensurate decrease in the breakdown voltage. Further, the on-resistance is reduced both because of the additional dopant diffused into the epitaxial layer and also because the thickness of the epitaxial layer can be reduced, while maintaining the same voltage across it, since it is more heavily doped.

Figure 4:
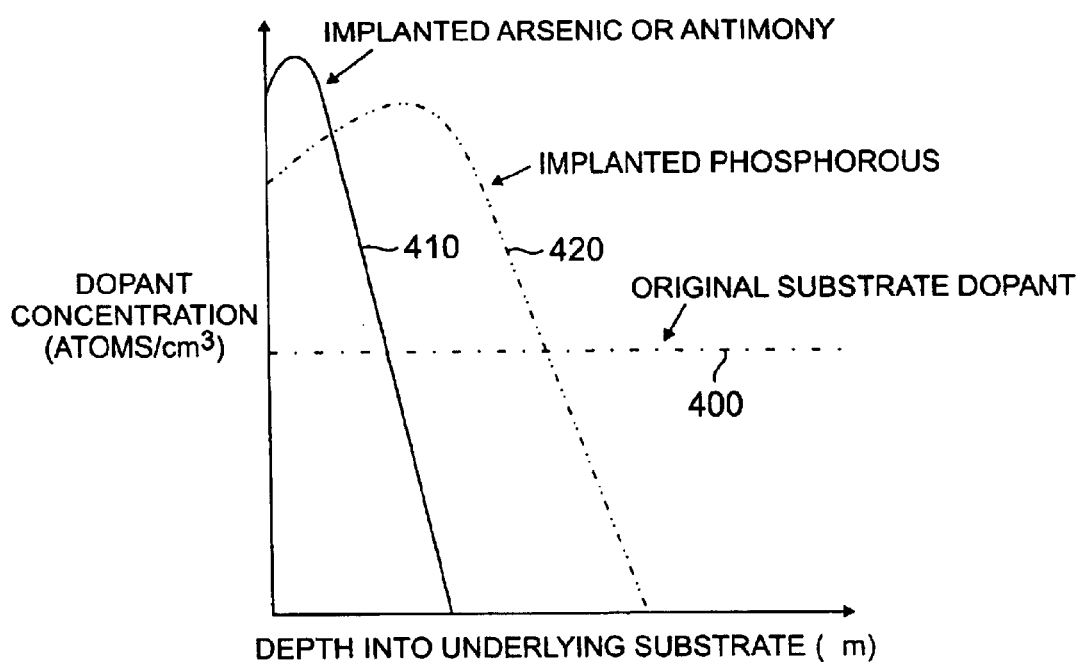
FIG. 4 shows the dopant profile of the substrate on which is formed the transistor of FIG. 3.

For purposes of illustration only, in what follows the substrate will be assumed to be an n+ substrate as depicted in FIG. 3. Typical dopants that may be used therefore include arsenic, antimony, phosphorous, or any combination thereof. FIG. 4 shows the dopant profile of the substrate 300 in which the abscissa represents the depth into the substrate with the origin defined as the substrate surface. Curve 400 represents the dopant profile of the original, uniformly doped substrate. Curve 410 represents the dopant profile after arsenic or antimony is implanted into the substrate and curve 420 represents the dopant profile after phosphorous is implanted into the substrate.

Figure 5:
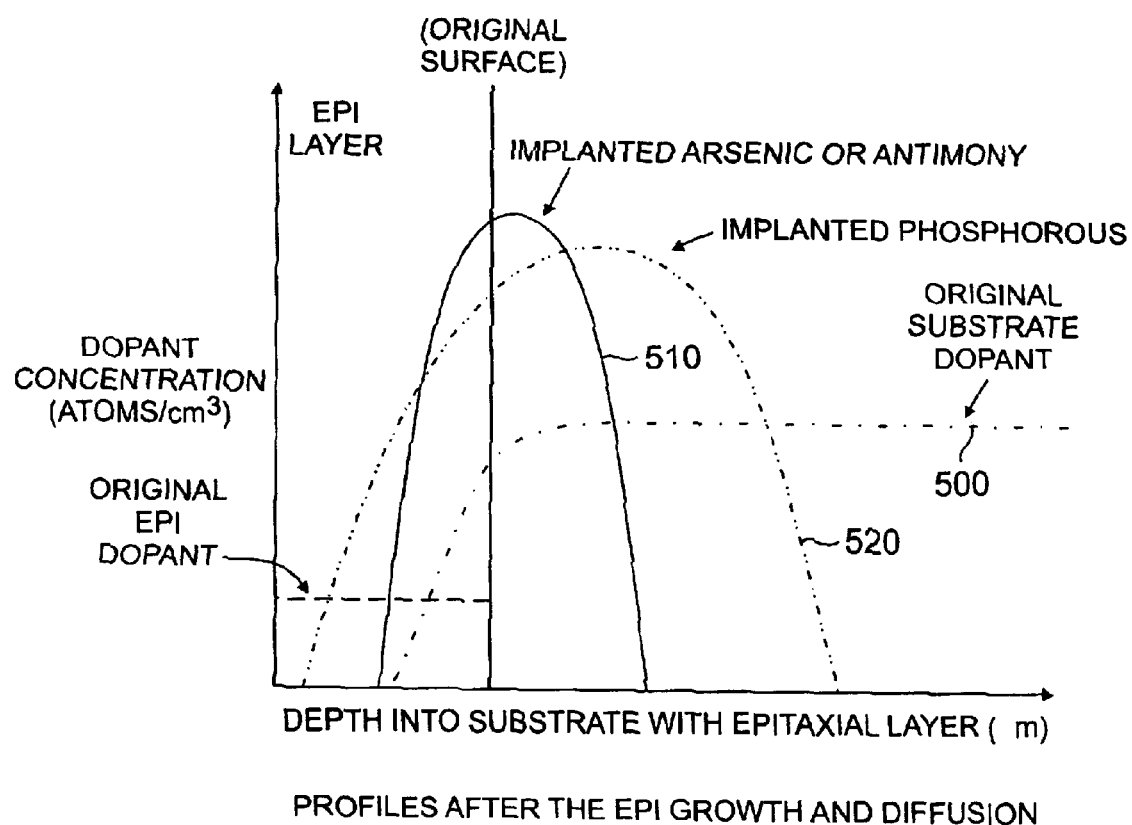
FIG. 5 shows the doping profile through the epitaxial layer of the device shown in FIG. 3 after formation of the transistor.

FIG. 5 shows the resulting doping profile after forming the various layers of the transistor on the substrate 300. Curve 500 represents the dopant profile of a conventional device formed on a uniformly doped substrate. Curve 510 represents the dopant profile of a device that is formed on a substrate in which arsenic or antimony is implanted and curve 520 represents a device that is formed on a substrate in which phosphorous is implanted. As shown, the dopants diffuse from the substrate 300 into the epitaxial layer 304 so that the dopant concentration decreases with increasing distance from the substrate-epitaxial layer interface. The difference between curves 510 and 520 is attributable to the different diffusion coefficients of the different species. Specifically, the diffusion coefficient of phosphorous is greater than the diffusion coefficient of either arsenic or antimony. It should be noted that the dopant profiles shown in FIG. 5 include the dopants originally present in the epitaxial layer material prior to its deposition.

In some embodiments of the invention it may be desirable to introduce two or more dopant species into the substrate. For example, a relatively fast diffusing species such as phosphorous may be introduced with a relatively slow diffusing species such as arsenic or antimony, which produces a dopant profile in the epitaxial layer that is the sum of the profile of the two species. For the same implant dose for each species, such a profile will have a lower concentration of the fast diffusing species near the surface of the epitaxial layer and a higher concentration near the epitaxial layer-substrate interface. This combination of doping profiles results in a device with a lower on-resistance.

One of ordinary skill in the art will recognize that there are a number of parameters that will determine the optimal amount of dopant that should be introduced into the substrate to decrease the on-resistance of the resulting device without also substantially reducing its breakdown voltage. These parameters include the particular dopant species that is introduced, the amount of dopant present in the original substrate, the diffusion time, and the diffusion temperature. For a given device, optimization may be achieved empirically or by various modeling techniques. If only one dopant species is to be introduced into the substrate, it will selected based on its diffusion coefficient, its solid solubility, its vapor pressure during epitaxial deposition, as well as epitaxial deposition parameters such as the deposition gas, temperature, pressure and the particular reactor that is employed.

The inventive trench field effect transistor shown in FIG. 3 may be fabricated in accordance with any conventional processing technique. While one exemplary technique, is discussed below, it should be understood that the fabrication of the present invention is not limited to this technique, which is presented only by way of illustration.

Figure 6A:
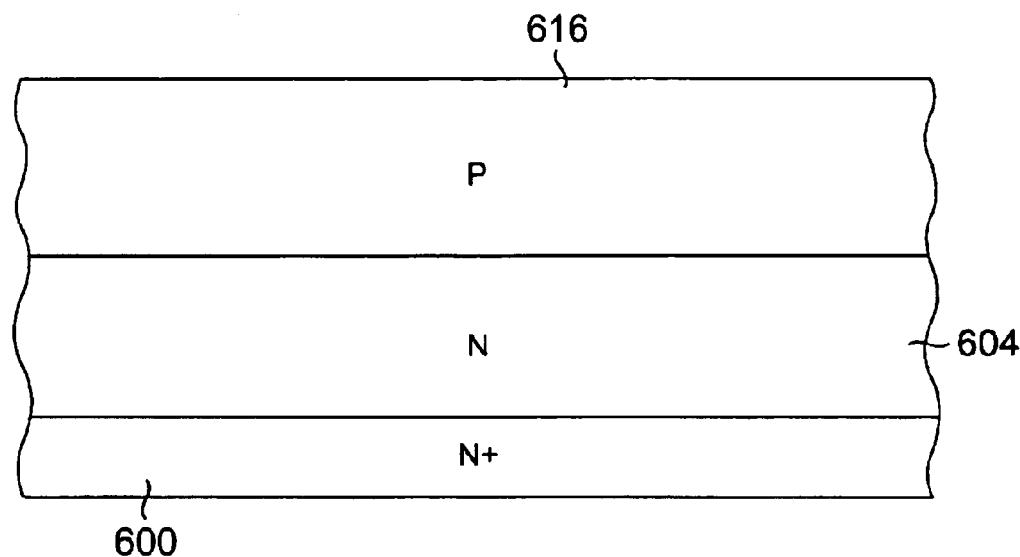
FIGS. 6(a)–6(f) shows a series of exemplary steps that are performed to form the transistor depicted in FIG. 3.

FIGS. 6(a)–6(f) shows a series of exemplary steps that are performed to form the transistor depicted in FIG. 3. In FIG. 6(a), an N– doped epitaxial layer 604 is grown on a N+ doped substrate 600. Prior to formation of epitaxial layer 604, substrate 600 is implanted with one or more dopant species in the previously described manner. Epitaxial layer 604 is typically 5.5 microns in thickness for a 30 V device. Next, P-body region 616 is formed in an implantation and diffusion step. Since the P-body implant is uniform across the substrate, no mask is needed. The P-body regions are boron implanted at 40 to 60 KeV with a dosage of about $5.5 \times 10^{13}/cm^3$.

Figure 6B:
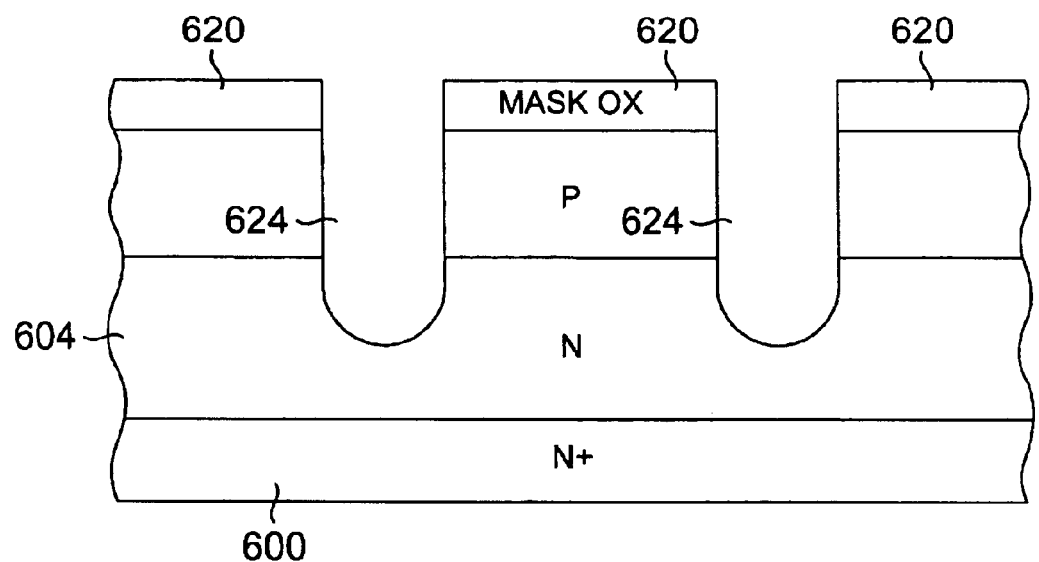

In FIG. 6(b), a mask layer is formed by covering the surface of epitaxial layer 604 with an oxide layer, which is then conventionally exposed and patterned to leave mask portions 620. Mask portions 620 are used for defining the location of the trenches. Trenches 624 are dry etched through the mask openings by reactive ion etching to a depth that typically ranges from 1.5 to 2.5 microns.

Figure 6C:
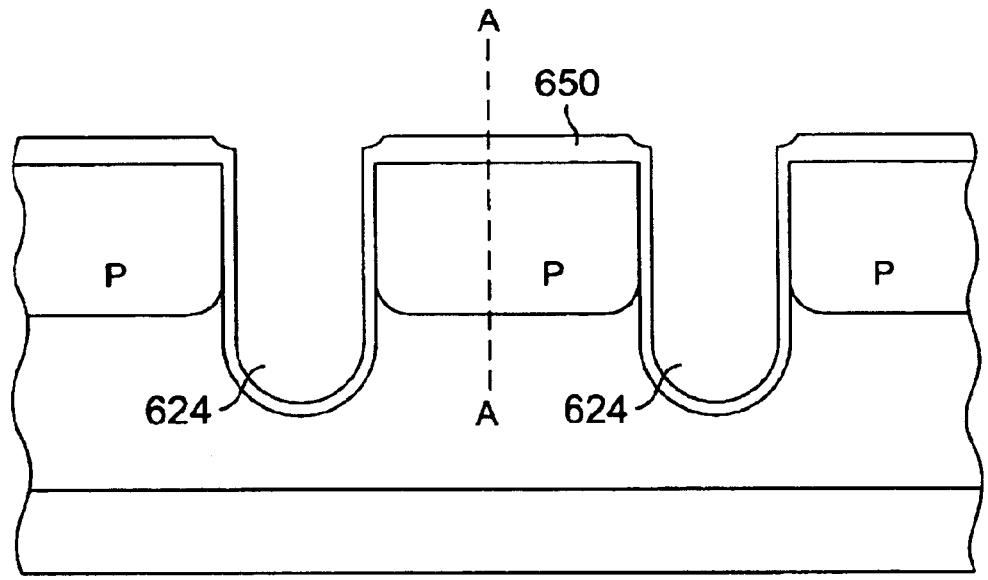

In FIG. 6(c), the sidewalls of each trench are smoothed. First, a dry chemical etch may be used to remove a thin layer of oxide (typically about 500–1000 angstroms) from the trench sidewalls to eliminate damage caused by the reactive ion etching process. Next, a sacrificial silicon dioxide layer 650 is grown over trenches 624 and mask portions 620. The sacrificial layer 650, as well as mask portions 620, are removed either by a buffer oxide etch or an HF etch so that the resulting trench sidewalls are as smooth as possible.

Figure 6D:
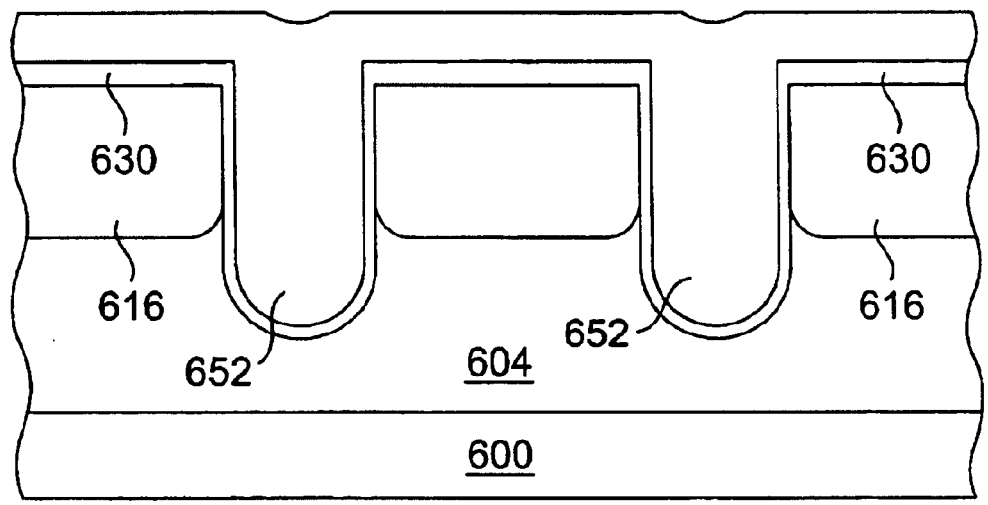

As shown in FIG. 6(d), the gate oxide layer 630 is then grown or deposited on the entire structure so that it covers the trench walls and the surface of p-body 616. Gate oxide layer 130 typically has a thickness in the range of 500–800 angstroms. Next, the trenches 624 are filled with polysilicon 652, i.e., polycrystalline silicon. Following the deposition, the polysilicon is typically doped with phosphorous using phosphorous oxychloride ($POCl_3$) or implanted with arsenic or phosphorous to reduce its sheet resistance to a value typically in the range of 20 $\Omega$/square.

Figure 6E:
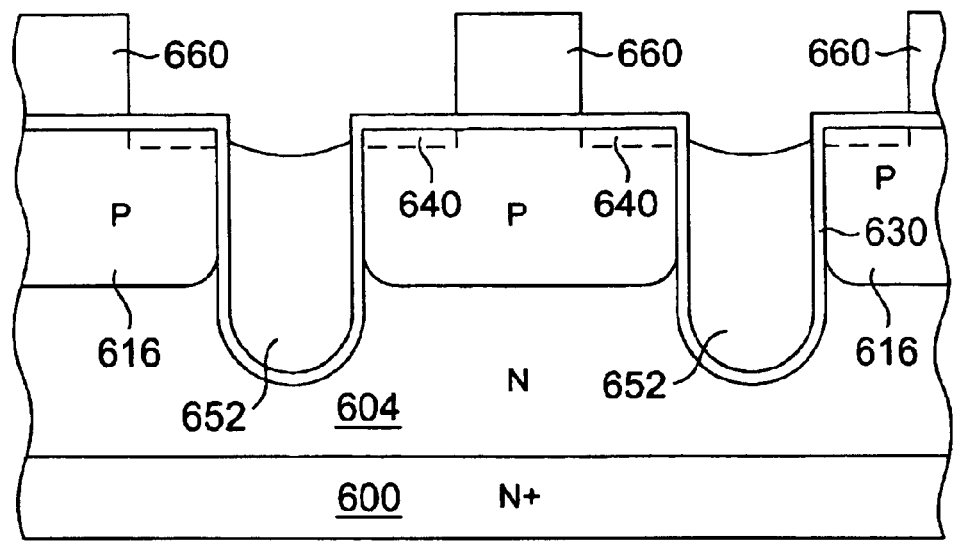
Figure 6F:
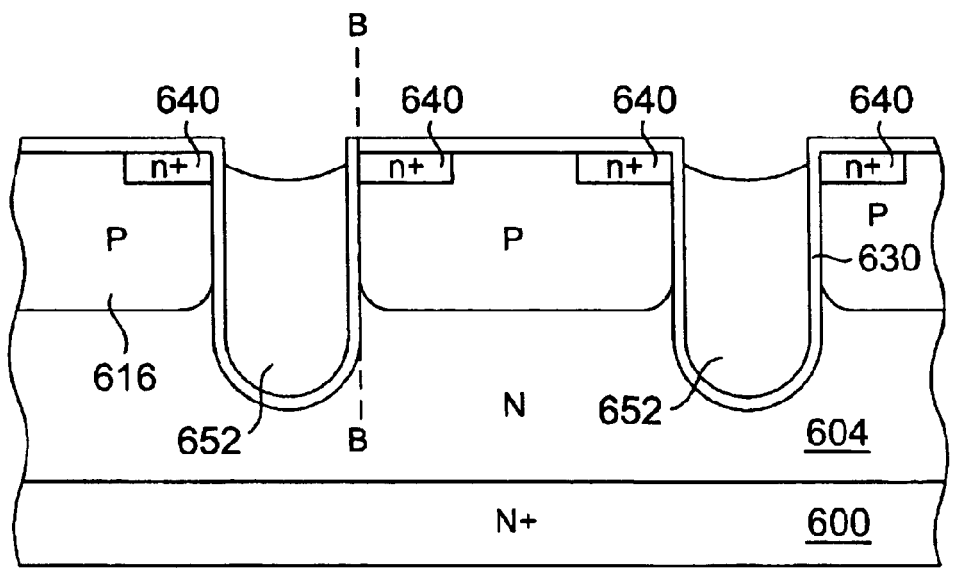

In FIG. 6(e), the polysilicon layer 652 is etched to optimize its thickness and to expose the portion of the gate oxide layer 630 that extends over the surface of p-body 616. Next, a photoresist masking process is used to form patterned masking layer 660. Patterned masking layer 660 defines source regions 640. Source regions 640 are then formed by an implantation and diffusion process. For example, the source regions may be implanted with arsenic at 80 KeV with a dose that is typically in the range of $8 \times 10^{15}$ to $1.2 \times 10^{16}$ per $cm^2$. After implantation, the arsenic is diffused to a depth of approximately 0.5 microns. Finally, masking layer 660 is removed in a conventional manner to form the structure depicted in FIG. 6(f).

The trench field effect transistor is completed in a conventional manner by forming and patterning a BPSG layer over the structure to define BPSG regions associated with the source and gate contacts. Next, a layer of metal is deposited and defined, forming source and gate electrodes. If desired, a layer of passivation is next deposited, and openings are formed in it to allow access to the source and gate pads. Also, a drain contact layer is formed on the bottom surface of the substrate.

Figure 1:
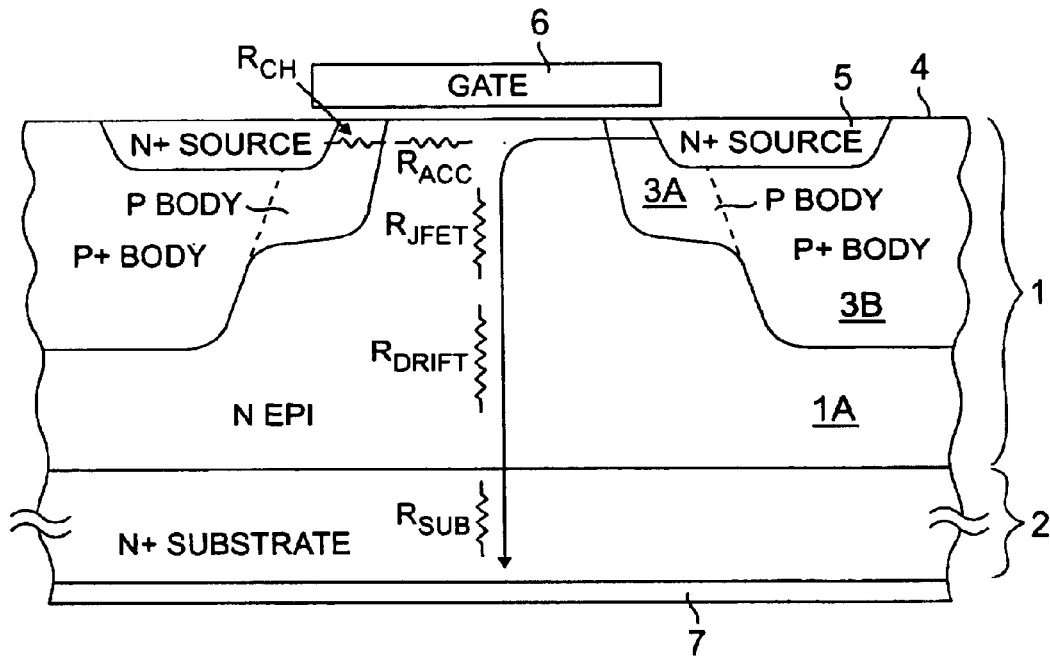
FIG. 1 is a simplified cross-sectional diagram of a conventional planar double diffused field effect transistor.
Figure 2:
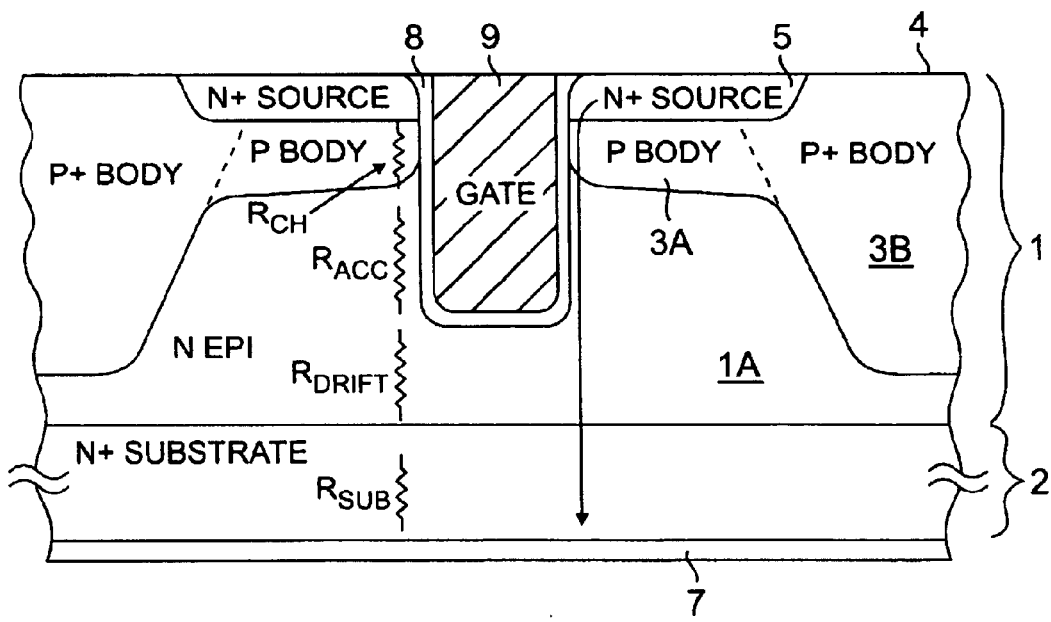
FIG. 2 is a simplified cross-sectional diagram of a trench field effect transistor.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a double diffused trench field effect transistor in which the conductivities of the various semiconductor regions are reversed from those described herein. Moreover, while the invention has been described in terms of a trench field effect transistor, it is equally applicable to double diffused field effect transistors with other configurations such as shown in FIG. 1, for example.

What is claimed is:

1. A double diffused field effect transistor made in accordance with the method comprising:

providing a substrate of a first conductivity type;

introducing at least two dopant species of said first conductivity type, but with different diffusivities, into a surface of the substrate so that the substrate has a nonuniform doping profile;

forming an epitaxial layer of said first conductivity type over said substrate;

forming one or more body regions of a second conductivity type within said epitaxial layer;

forming a plurality of source regions of said first conductivity type within said body regions; and forming a gate region adjacent to said one or more body regions, wherein said introducing step is performed prior to said step of forming an epitaxial layer.

2. A double diffused field effect transistor made in accordance with the method of claim 1 wherein the step of forming the gate region includes the steps of:

forming a plurality of trenches within said epitaxial layer;

forming a first insulating layer that lines said trenches; and forming a polysilicon conductor within said trenches and overlying the first insulating layer.

3. A double diffused field effect transistor, comprising:

a substrate of a first conductivity type;

at least two dopant species of said first conductivity type, but with different diffusivities, incorporated into a surface of the substrate so that the substrate has a nonuniform doping profile, said nonuniform doping profile having a dopant concentration that is greatest at a given depth below a surface layer of said substrate and which decreases with increasing distance away from said given depth;

an epitaxial layer of said first conductivity type located over said surface layer of said substrate;

one or more body regions of a second conductivity type disposed within said epitaxial layer;

a plurality of source regions of said first conductivity type located within said body regions; and a gate region adjacent to said one or more body regions.

4. The double diffused field effect transistor of claim 3 wherein said gate region includes:

a plurality of trenches located within said epitaxial layer;

a first insulating layer that lines said trenches; and a polysilicon conductor located within said trenches and overlying the first insulating layer.

5. The double diffused field effect transistor of claim 3 wherein said at least two dopant species is introduced into the substrate by ion implantation.

6. The double diffused field effect transistor of claim 3 wherein said at least two dopant species is selected from the group consisting of arsenic, antimony and phosphorous.

7. The double diffused field effect transistor of claim 3 wherein said substrate has a substantially uniform doping profile prior to introducing said at least two dopant species.

8. The double diffused field effect transistor of claim 3 further comprising an electrode layer disposed on a surface of the substrate opposite the body regions.

* * * * *